United States Patent
Pindicura et al.

(10) Patent No.: US 11,321,225 B2
(45) Date of Patent: May 3, 2022

(54) REDUCING THE MEMORY LOAD TIME FOR LOGIC SIMULATOR BY LEVERAGING ARCHITECTURE SIMULATOR

(71) Applicant: International Business Machines Corporation, Armonk, NY (US)

(72) Inventors: Tharunachalam Pindicura, Austin, TX (US); Shricharan Srivatsan, Austin, TX (US); Vivek Britto, Austin, TX (US); Yan Xia, Austin, TX (US); Aishwarya Dhandapani, Folson, CA (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/881,628

(22) Filed: May 22, 2020

(65) Prior Publication Data
US 2021/0365294 A1    Nov. 25, 2021

(51) Int. Cl.
*G06F 9/44*    (2018.01)
*G06F 11/36*    (2006.01)
(Continued)

(52) U.S. Cl.
CPC ........ *G06F 11/3672* (2013.01); *G06F 9/5016* (2013.01); *G06F 11/302* (2013.01);
(Continued)

(58) Field of Classification Search
CPC .... G06F 12/122; G06F 30/33; G06F 11/3672; G06F 11/3688; G06F 11/362;
(Continued)

(56) References Cited

U.S. PATENT DOCUMENTS

| 7,630,862 B2 | 12/2009 | Glas et al. |
| 8,122,509 B1 | 2/2012 | Belov |

(Continued)

OTHER PUBLICATIONS

Holliday, "Techniques for Cache and Memory Simulation Using Address Reference Traces", Duke University, Department of Computer Science, Dec. 1990, pp. 1-25.
(Continued)

*Primary Examiner* — Tuan A Vu
(74) *Attorney, Agent, or Firm* — Scully, Scott, Murphy & Presser, P.C.

(57) ABSTRACT

A method, system and computer program product are disclosed for reducing the memory load time for logic simulator. In an embodiment, the method comprises identifying a memory for a program, and selectively loading onto a logic simulator parts of the memory that are pre-determined as parts of the memory that will be accessed by the program when the program is executed on the simulator. In an embodiment, the selectively loading onto a logic simulator parts of the memory includes pre-determining subsets of the memory that will be accessed by the program when the program is executed on the simulator, and loading the pre-determined subsets of the memory on the simulator. In an embodiment, the pre-determining subsets of the memory includes using addresses of the memory that are accessed by the program when the program is executed on a computer system, to create the pre-determined subsets of the memory.

20 Claims, 5 Drawing Sheets

Test load scenario with reduced memory image.

(51) Int. Cl.
  *G06F 9/50* (2006.01)
  *G06F 11/34* (2006.01)
  *G06F 11/30* (2006.01)
  *G05B 19/042* (2006.01)
  *G11C 29/10* (2006.01)

(52) U.S. Cl.
  CPC ........ *G06F 11/3471* (2013.01); *G06F 11/362* (2013.01); *G06F 11/3664* (2013.01); *G06F 11/3688* (2013.01); *G05B 19/042* (2013.01); *G11C 29/10* (2013.01)

(58) Field of Classification Search
  CPC .. G06F 9/5015; G06F 11/302; G06F 11/3471; G06F 11/3664; H04L 41/083; G11C 29/10; G05B 19/042
  See application file for complete search history.

(56) References Cited

U.S. PATENT DOCUMENTS

| | | | |
|---|---|---|---|
| 8,301,864 B2 | 10/2012 | Wang et al. | |
| 8,478,948 B2 | 7/2013 | Panchenko et al. | |
| 8,762,514 B2 | 6/2014 | Iijima | |
| 9,817,744 B2 | 11/2017 | Luo et al. | |
| 2004/0068627 A1* | 4/2004 | Sechrest | G06F 12/122 711/158 |
| 2004/0221268 A1* | 11/2004 | Nichols | G06F 11/362 717/124 |
| 2006/0089827 A1* | 4/2006 | Gabele | G06F 30/33 703/17 |
| 2008/0288719 A1 | 11/2008 | Schmitt et al. | |
| 2009/0216341 A1* | 8/2009 | Enkerud | G05B 19/042 700/17 |
| 2009/0326902 A1 | 12/2009 | Nomura et al. | |
| 2012/0185669 A1* | 7/2012 | Teranishi | G06F 11/3672 711/209 |
| 2013/0132063 A1 | 5/2013 | Rieschi et al. | |
| 2013/0339612 A1* | 12/2013 | Suzuki | G11C 29/10 711/127 |
| 2016/0105308 A1* | 4/2016 | Dutt | H04L 41/083 709/221 |
| 2017/0010971 A1 | 1/2017 | Mizrahi et al. | |
| 2017/0147225 A1 | 5/2017 | Geissinger | |
| 2017/0286270 A1* | 10/2017 | Hufnagel | G06F 11/3688 |
| 2018/0068741 A1 | 3/2018 | Dodson et al. | |

OTHER PUBLICATIONS

Yi et al., "Fast And Accurate Cosimulation of MPSoC Using Trace-Driven Virtual Synchronization", IEEE Transactions On, vol. 26, No. 12, Dec. 20, 2007, pp. 2186-2200.

Diaz et al., "Obtaining memory Address Traces From Native Co-Simulation For Data Cache Modeling In SystemC", University Of Cantabria, Santander, Spain, Jan. 2010, pp. 1-7.

Uhlig et al., "Trace-Driven Memory Simulation: A Survey", IRISA/INRIA Campus De Beaulieu, France, ACM Computing Surveys CSUR, vol. 29, Issue 2, Jun. 1997, pp. 1-50.

\* cited by examiner

Process flow of generating reduced memory image.

400

1. 0x0000000001340108
2. 0x0000000001341A00
3. 0x0000000001341A80
4. 0x0000000001341A84
5. 0x000000000134BAA8
6. 0x000000000134BAB0
7. 0x000000000134BAB8
8. 0x000000000134BAF8
9. 0x000000000134FC50
10. 0x00000000013500A0
11. 0x00000000013500B4
12. 0x00000000013500F4
13. 0x0000000001350104
14. 0x0000000001350114
15. 0x0000000001350128
16. 0x0000000001350130
17. 0x0000000001350138
18. 0x0000000001390000
19. 0x00000000013B0100
20. 0x00000000013B0108
21. 0x00000000013B0220
22. 0x00000000013DE5A8
23. 0x00000000013DE730
24. 0x00000000013DE738
25. 0x00000000013DE740
26. 0x00000000013DE748

502 — Create A List Of Minimal Address Ranges

504 — Use The List of Address Ranges To Form Subsets

REDUCING THE MEMORY LOAD TIME FOR LOGIC SIMULATOR BY LEVERAGING ARCHITECTURE SIMULATOR

BACKGROUND

This invention generally relates to loading memory into a logic simulator, and more specifically, to reducing the time needed to load the memory onto the logic simulator.

SUMMARY

According to an embodiment of the present invention, a method comprises identifying a memory for a program, and selectively loading onto a logic simulator parts of the memory that are pre-determined as parts of the memory that will be accessed by the program when the program is executed on the logic simulator.

In an embodiment, the selectively loading onto a logic simulator parts of the memory that are pre-determined as parts of the memory that will be accessed by the program when the program is executed on the logic simulator includes pre-determining subsets of the memory as subsets of the memory that will be accessed by the program when the program is executed on the logic simulator, and loading the pre-determined subsets of the memory on the logic simulator.

In an embodiment, the loading the pre-determined subsets of the memory on the logic simulator includes from the memory, only loading the parts of the memory that are pre-determined as subsets of the memory that will be accessed by the program when the program is executed on the logic simulator.

In an embodiment, the pre-determining subsets of the memory as subsets of the memory that will be accessed by the program when the program is executed on the logic simulator includes using addresses of the memory that are accessed by the program when the program is executed on a computer system, to create the pre-determined subsets of the memory.

In an embodiment, the using addresses of the memory that are accessed by the program when the program is executed on a computer system, to create the pre-determined subsets of the memory includes obtaining a list of the addresses of the memory that are accessed by the program when the program is executed on the computer system, and using the list of the addresses of the memory that are accessed by the program when the program is executed on the computer system, to create the subsets of the memory.

According to an embodiment of the present invention, a system comprises one or more processors, and a memory coupled to the one or more processors, said one or more processors configured for identifying a memory for a program, and selectively loading onto a logic simulator parts of the memory that are pre-determined as parts of the memory that will be accessed by the program when the program is executed on the logic simulator.

In an embodiment, the selectively loading onto a logic simulator parts of the memory that are pre-determined as parts of the memory that will be accessed by the program when the program is executed on the logic simulator includes pre-determining subsets of the memory as subsets of the memory that will be accessed by the program when the program is executed on the logic simulator, and loading the pre-determined subsets of the memory on the logic simulator.

In an embodiment, the pre-determining subsets of the memory as subsets of the memory that will be accessed by the program when the program is executed on the logic simulator includes using addresses of the memory that are accessed by the program when the program is executed on a computer system, to create the pre-determined subsets of the memory.

In embodiments of the invention, the using addresses of the memory that are accessed by the program when the program is executed on a computer system, to create the pre-determined subsets of the memory includes obtaining a list of the addresses of the memory that are accessed by the program when the program is executed on the computer system, and using the list of the addresses of the memory that are accessed by the program when the program is executed on the computer system, to create the subsets of the memory.

In embodiments of the invention, the using the addresses of the memory that are accessed by the program when the program is executed on a computer system, to create the pre-determined subsets of the memory includes creating a multitude of contiguous address ranges that contain all of the addresses of the memory that are accessed by the program when the program is executed on the computer system, to create the pre-determined subsets of the memory, and using the created contiguous address ranges to create the subsets of the memory.

Embodiments of the invention reduce the time needed to load memory onto a logic simulator that is required to test a program. Generally, this is done by selectively loading the parts of the address space that will be accessed when running the test program. In embodiments of the invention, an architecture simulator is used to determine the memory addresses that will be accessed when running the test program, and the determined memory addresses are further processed to create contiguous address ranges that contain all the addresses accessed. These address ranges are then used to create memory subsets from the full memory image. Loading the memory subsets instead of the full memory image (full address space) significantly reduces the test load time for the logic simulator.

DETAILED DESCRIPTION

Emulator/accelerator environments are often used to run complex tests with very large address spaces. Embodiments of the invention save valuable simulation time by reducing the time spent in loading the test into the simulator. This also allows testing of larger more complex applications in pre-silicon simulations.

Figure 1:
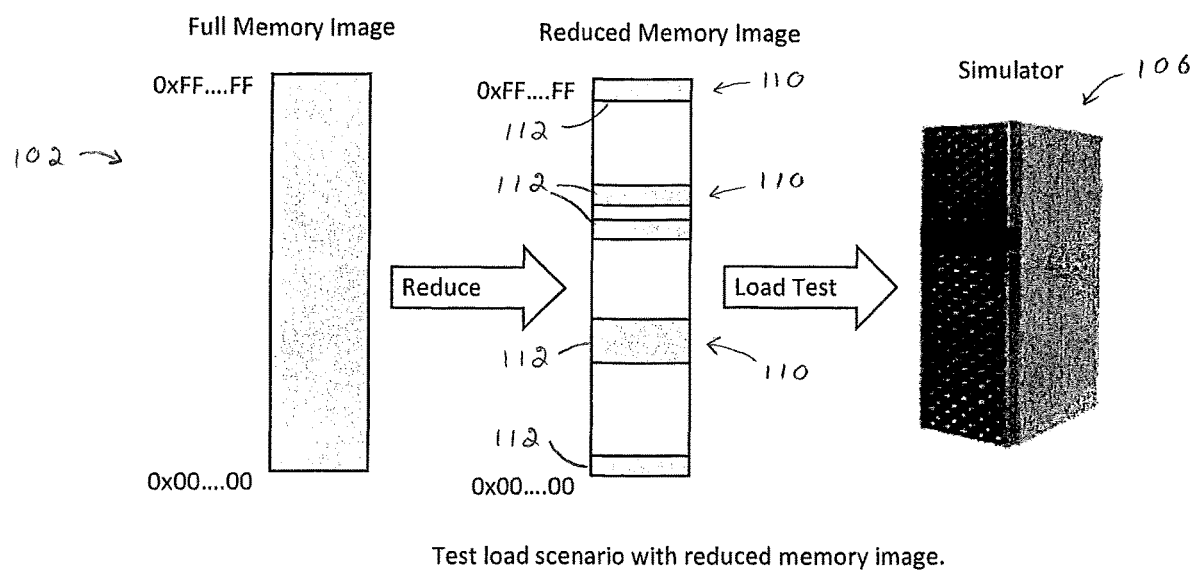
FIG. 1 illustrates a test load scenario with reduced memory image in accordance with an embodiment of the invention.

Embodiments of the invention provide a method, system, and computer program product for reducing the memory load time for logic simulator by leveraging architecture simulator. With reference to FIG. 1, in an embodiment, the method comprises identifying a memory 102 for a program, and selectively loading onto a logic simulator 106 parts 110 of the memory that are pre-determined as parts of the memory that will be accessed by the program when the program is executed on the logic simulator. In embodiments, the selectively loading onto a logic simulator 106 parts 110 of the memory 102 that are pre-determined as parts of the memory that will be accessed by the program when the program is executed on the logic simulator includes pre-determining subsets 112 of the memory as subsets of the memory that will be accessed by the program when the program is executed on the logic simulator, and loading the pre-determined subsets of the memory on the logic simulator.

The test program can then be executed on the logic simulator 106 to perform various testes to analyze the program. Logic simulators and the way they are used are well known and understood in the art, and any suitable logic simulator may be used in or with this invention.

Figure 2:
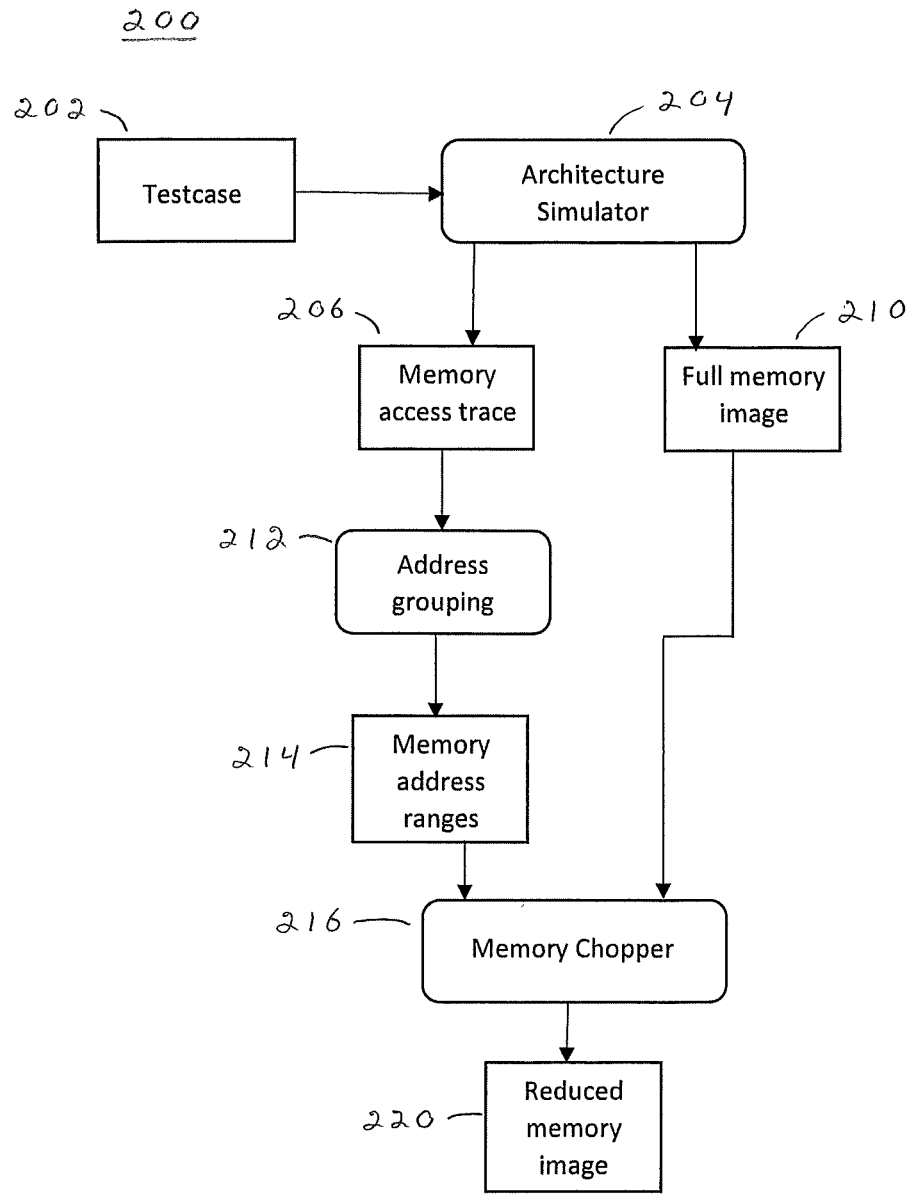
FIG. 2 shows a process flow of generating reduced memory images in accordance with an embodiment of the invention.

FIG. 2 shows a process flow 200 of generating reduced memory images. A test case 202 is input into architecture simulator 204, and the simulator outputs a memory access trace 206 and a full memory image 210. The memory access trace is processed by address grouping 212 to identify memory address ranges 214. These identified address ranges are used, as represented at 216, to create subsets of the full memory image 210 that form the reduced memory image.

Figure 3:
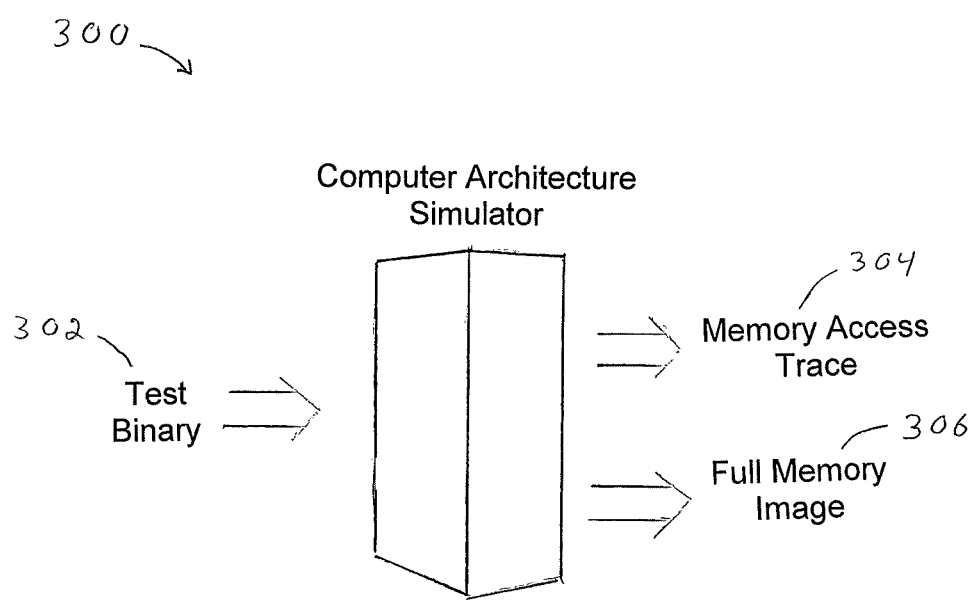
FIG. 3 shows a system and procedure for generating a memory access trace and a full memory image.

FIG. 3 shows a computer architecture simulator 300 that, in embodiments of the invention, is used to determine the addresses that will be accessed when running the test program. Computer architecture simulators are well known software programs configured to run on a computer system that emulates the instruction set and architecture of another computer system. Commonly, the former computer system is a modern computer system and the latter computer system is an older computer system, and the emulator is run to analyze a software program that has been operating on the older computer system to determine if the software program can be run on modern computer systems. As part of this process, the emulator 300, among other functions, tracks accesses made by the program to memory and the emulator outputs a list, referred to as a memory trace, of these memory accesses. Any suitable computer architecture simulator can be used in embodiments of the invention.

In an embodiment of the invention, test binary 302, including a program to be tested, is input into the emulator 300, and the program is run. The emulator generates a memory access trace 304 and a full memory image 306. In embodiments of the invention, the test binary includes the program to be tested and the memory data. The full memory image is a memory from the architecture simulator. This contains the memory data that was loaded into the architecture simulator. This memory image can also be created using the memory data input of the architecture simulator.

Figures 4, 5:
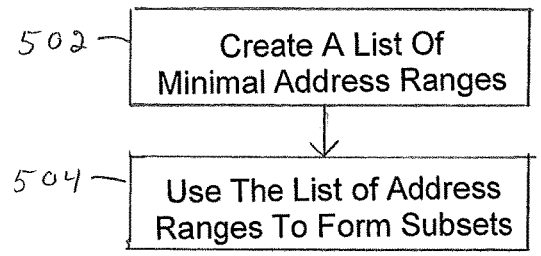
FIG. 4 shows a section of a sample memory trace obtained from the system of FIG. 3 in accordance with an embodiment of the invention.
FIG. 5 illustrates a procedure for using the memory trace to form subsets of the full memory image.

FIG. 4 shows a small section 400 of a sample memory trace. Each line of the memory trace identifies an address of a memory location accessed by the program.

The memory access trace is processed through an address grouping tool. In embodiments of the invention, this creates a list of minimal address ranges that encompass the access trace.

The memory access trace is processed through an address grouping tool. With reference to FIG. 5, in embodiments of the invention, the processing through the address grouping tool, at 502, creates a list of minimal address ranges that encompass the access trace, and at 504, the address ranges are used to create memory subsets.

The address grouping script takes this memory trace as an input. The output 'address group list' format is <start address>:<group size>.

As examples, if the minimum group size is set to 64 kB, the output (address group list) would be this:
0x0000000001340108:0x30000
This group starts at address 0x0000000001340108 and ends at 0x0000000001340108+0x30000. It covers lines 1-17 in the sample memory trace of FIG. 4.
0x0000000001390000:0x10000
This group starts at address 0x0000000001390000 and ends at 0x0000000001390000+0x10000. It covers line 18 in the sample memory trace.
0x00000000013b0100:0x20000
This group starts at address 0x00000000013b0100 and ends at 0x00000000013b0100+0x20000. It covers lines 19-21 in the sample memory trace.
0x00000000013de5a8:0x20000
This group starts at address 0x00000000013de5a8 and ends at 0x00000000013de5a8+0x20000. It covers lines 21-26 in the sample memory trace.

With reference again to FIG. 1, the list of address ranges is used to create subsets 112 of the full memory images 102. This reduced image is loaded into the logic simulator 106. This reduced memory image contains all the memory accesses that are required for successful test execution.

When the reduced memory image and the test program are loaded on the logic simulator, the simulator can be operated to analyze the test program. As discussed above, embodiments of the invention save valuable simulation time by reducing the time spent in loading the test into the simulator. This also allows testing of larger more complex applications in pre-silicon simulations.

Figure 6:
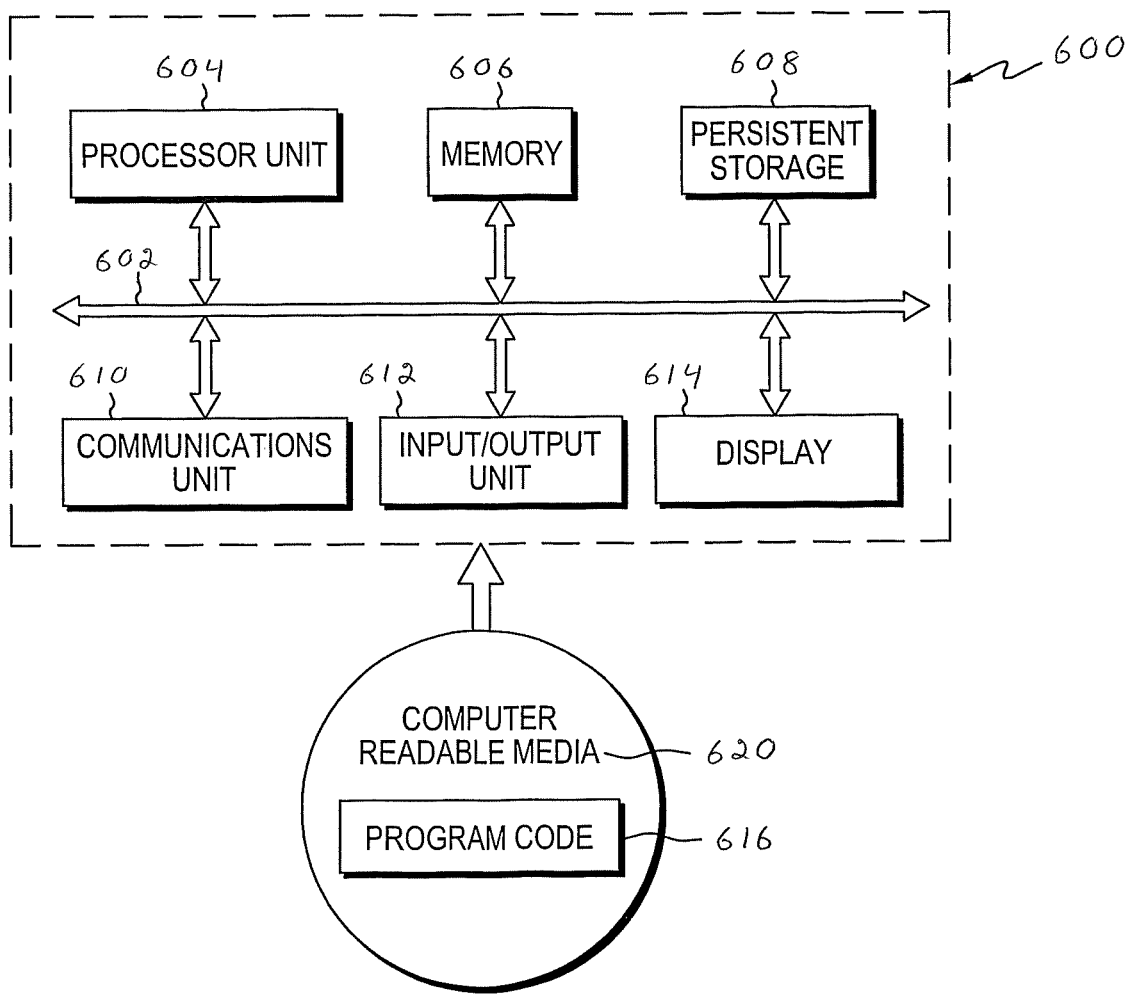
FIG. 6 depicts a processing unit that may be used in embodiments of the invention.

With reference to FIG. 6, a block diagram of a data processing system 600 is shown. Data processing system 600 is an example of a processing unit that may be used in, or with, embodiments of the invention. For example, data processing system 600 may also be used in or with the logic simulator 106 of FIG. 1 or the computer architecture simulator 300 of FIG. 3.

In this illustrative example, data processing system 600 includes communications fabric 602, which provides communications between processor unit 604, memory 606, persistent storage 608, communications unit 610, input/output (I/O) unit 612, and display 614.

Processor unit 604 serves to execute instructions for software that may be loaded into memory 806. Processor unit 604 may be a set of one or more processors or may be a multi-processor core, depending on the particular implementation. Memory 606 and persistent storage 608 are examples of storage devices. Memory 606, in these examples, may be a random access memory or any other suitable volatile or non-volatile storage device. Persistent storage 608 may take various forms depending on the particular implementation. For example, persistent storage 608 may be a hard drive, a flash memory, a rewritable optical disk, a rewritable magnetic tape, or some combination of the above.

Communications unit 610, in these examples, provides for communications with other data processing systems or devices. In these examples, communications unit 610 is a network interface card. Communications unit 610 may provide communications through the use of either or both physical and wireless communications links. Input/output unit 612 allows for input and output of data with other devices that may be connected to data processing system 600. For example, input/output unit 612 may provide a connection for user input through a keyboard and mouse. The input/output unit may also provide access to external program code 616 stored on a computer readable media 620. In addition, input/output unit 612 may send output to a printer. Display 614 provides a mechanism to display information to a user.

Those of ordinary skill in the art will appreciate that the hardware in FIG. 6 may vary depending on the implementation. Other internal hardware or peripheral devices, such as flash memory, equivalent non-volatile memory, or optical disk drives and the like, may be used in addition to or in place of the hardware depicted in FIG. 6.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The description of the invention has been presented for purposes of illustration and description, and is not intended to be exhaustive or to limit the invention in the form disclosed. Many modifications and variations will be apparent to those of ordinary skill in the art without departing from the scope of the invention. The embodiments were chosen and described in order to explain the principles and applications of the invention, and to enable others of ordinary skill in the art to understand the invention. The invention may be implemented in various embodiments with various modifications as are suited to a particular contemplated use.

The invention claimed is:

1. A computer-implemented method for reducing load time onto a logic simulator of a computer, the method comprising:
    providing a test binary that comprises a memory and a test program;
    identifying the memory; and
    selectively loading parts of the memory onto the logic simulator that are pre-determined as parts of the memory that will be accessed by the test program in response to the test program being executed on the logic simulator, wherein selectively loading parts of the memory onto the logic simulator reduces the loading time onto the logic simulator.

2. The method according to claim 1, wherein the selectively loading parts of the memory onto the logic simulator that are pre-determined as parts of the memory that will be accessed by the test program in response to the test program being executed on the logic simulator comprises:
    pre-determining subsets of the memory as subsets of the memory that will be accessed by the test program in response to the test program being executed on the logic simulator; and
    loading the pre-determined subsets of the memory on the logic simulator.

3. The method according to claim 2, wherein the Loading the pre-determined subsets of the memory on the logic simulator comprises from the memory, only loading the parts of the memory that are pre-determined as subsets of the memory that will be accessed by the test program in response to the test program being executed on the logic simulator.

4. The method according to claim 2, wherein the pre-determining subsets of the memory as subsets of the memory that will be accessed by the test program in response to the test program being executed on the logic simulator comprises:
    using addresses of the memory accessed by the test program when the test program is executed on a computer system, to create the pre-determined subsets of the memory.

5. The method according to claim 4 wherein the using addresses of the memory accessed by the test program when the test program is executed on a computer system, to create the pre-determined subsets of the memory comprises:
    obtaining a list of the addresses of the memory accessed by the test program when the test program is executed on the computer system; and
    using the list of the addresses of the memory accessed by the test program when the test program is executed on the computer system, to create the subsets of the memory.

6. The method according to claim 5, wherein the obtaining a list of the addresses of the memory accessed by the test program when the test program is executed on the computer system comprises:
    executing the test program on the computer system; and
    while the test program is executing on the computer system, generating a trace of addresses of the memory accessed by the test program.

7. The method according to claim 6, wherein the computer system is a computer architecture emulator executing computer architecture emulator software while the program is executing on the computer system.

8. The method according to claim 5, wherein the using the list of the addresses to create the subsets of the memory comprises:
    grouping the addresses of the memory accessed by the test program when the program is executing on the computer system; and
    using said groups of the addresses to create the subsets of the memory.

9. The method according to claim 8, wherein each of the created subsets of the memory is larger than a pre-determined minimum size.

10. The method according to claim 4, wherein the using the addresses of the memory accessed by the test program when the test program is executed on a computer system, to create the pre-determined subsets of the memory comprises:
    creating a multitude of contiguous address ranges that contain all of the addresses of the parts of the memory accessed by the test program when the test program is executed on the computer system, to create the pre-determined subsets of the memory; and
    using the contiguous address ranges to create the subsets of the memory.

11. A system for reducing the load time onto a logic simulator of a computer, the system comprising:
    one or more processors; and
    a memory coupled to the one or more processors;
    said one or more processors configured for:
    receiving a test binary comprising a memory and a test program;
    identifying the memory; and
    selectively loading parts of the memory onto the logic simulator that are pre-determined as parts of the memory that will be accessed by the test program in response to the test program being executed on the logic simulator, wherein the selectively loading the parts of the memory onto the logic simulator reduces the load time onto the logic simulator.

12. The system according to claim 11, wherein the selectively loading parts of the memory onto the logic simulator that are pre-determined as parts of the memory that will be accessed by the test program in response to the test program being executed on the logic simulator comprises:

pre-determining subsets of the memory as subsets of the memory that will be accessed by the test program in response to the test program being executed on the logic simulator; and loading the pre-determined subsets of the memory on the logic simulator.

13. The system according to claim 12, wherein the pre-determining subsets of the memory as subsets of the memory that will be accessed by the test program in response to the test program being executed on the logic simulator includes:

using addresses of the memory accessed by the test program when the test program is executed on an emulator running on the one or more processors, to create the pre-determined subsets of the memory.

14. The system according to claim 13 wherein the using addresses of the memory accessed by the test program when the test program is executed on an emulator running on the one or more processors, to create the pre-determined subsets of the memory comprises:

obtaining a list of the addresses of the memory accessed by the test program when the test program is executed on the emulator running on the one or more processors; and using the list of the addresses of the memory accessed by the test program when the test program is executed on the emulator running on the one or more processors, to create the pre-determined subsets of the memory.

15. The system according to claim 13, wherein the using the addresses of the memory accessed by the test program when the test program is executed on an emulator running on one or more processors, to create the pre-determined subsets of the memory comprises:

creating a multitude of contiguous address ranges that contain all of the addresses of the memory accessed by the test program when the test program is executed on the emulator running on the one or more processors, to create the pre-determined subsets of the memory; and using the contiguous address ranges to create the pre-determined subsets of the memory.

16. A computer program product for reducing the memory load time for a logic simulator of a computer, the computer program product comprising a non-transitory computer readable storage medium having program instructions embodied therewith, the program instructions executable by a processor to cause the processor to:

receive a test binary comprising a memory and a test program;

identify the memory; and selectively load parts of the memory onto the logic simulator that are pre-determined as parts of the memory that will be accessed by the test program in response to the test program being executed on the logic simulator, wherein the selectively loading parts of the memory onto the logic simulator reduces the load time onto the logic simulator.

17. The computer program product according to claim 16, wherein the programming instructions executable on the processor to cause the processor to selectively load parts of the memory onto the logic simulator that are pre-determined as parts of the memory that will be accessed by the test program in response to the test program being executed on the logic simulator comprises programming instructions executable by the processor to cause the processor to:

pre-determine subsets of the memory as subsets of the memory that will be accessed by the test program in response to the test program being executed on the logic simulator; and load the pre-determined subsets of the memory on the logic simulator.

18. The computer program product according to claim 17, wherein the programming instructions executable on the processor to cause the processor to pre-determine subsets of the memory as subsets of the memory that will be accessed by the test program in response to the test program being executed on the logic simulator comprises programming instructions executable by the processor to cause the processor to:

use addresses of the memory accessed by the test program when the test program is executed on an emulator executable by the processor, to create the pre-determined subsets of the memory.

19. The computer program product according to claim 18 wherein the programming instructions executable on the processor to cause the processor to use addresses of the memory accessed by the test program when the test program is executed on an emulator executable by the processor, to create the pre-determined subsets of the memory comprises programming instructions executable by the processor to cause the processor to:

obtain a list of the addresses of the memory accessed by the test program when the test program is executed on the emulator executable by the processor; and use the list of the addresses of the memory accessed by the test program when the test program is executed on the emulator executable by the processor, to create the subsets of the memory.

20. The computer program product according to claim 18, wherein the programming instructions executable on the processor to cause the processor to use the addresses of the memory accessed by the test program when the test program is executed on an emulator executable by the processor, to create the pre-determined subsets of the memory comprises programming instructions executable by the processor to cause the processor to:

create a multitude of contiguous address ranges that contain all of the addresses of the memory accessed by the test program when the test program is executed on the emulator executable by the processor to create the pre-determined subsets of the memory; and use the contiguous address ranges to create the subsets of the memory.

\* \* \* \* \*